(12) United States Patent
Kong et al.

(10) Patent No.: US 8,634,510 B2
(45) Date of Patent: Jan. 21, 2014

(54) FULL DIGITAL BANG BANG FREQUENCY DETECTOR WITH NO DATA PATTERN DEPENDENCY

(75) Inventors: Xiaohua Kong, San Diego, CA (US); Vannam Dang, San Diego, CA (US); Tirdad Sowlati, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 254 days.

(21) Appl. No.: 13/005,271

(22) Filed: Jan. 12, 2011

(65) Prior Publication Data

US 2012/0177159 A1    Jul. 12, 2012

(51) Int. Cl.
*H04L 7/02*    (2006.01)

(52) U.S. Cl.
USPC ........... 375/359; 375/316; 375/326; 375/327; 375/340; 375/344; 375/354; 375/371; 375/375; 455/75; 455/119; 455/173.1; 455/182.1; 455/182.2; 455/192.1; 455/192.2; 455/502; 455/516; 327/141; 327/163; 370/516; 714/707

(58) Field of Classification Search
USPC ......... 375/359, 316, 326, 327, 340, 344, 354, 375/371, 375; 327/156, 100, 141, 155, 163; 455/75, 119, 173.1, 182.1, 182.2, 455/192.1, 192.2, 502, 516; 370/516; 714/707

See application file for complete search history.

(56) References Cited

U.S. PATENT DOCUMENTS 4,849,993 A    7/1989    Johnson et al.
5,939,912 A    8/1999    Rehm
6,538,475 B1   3/2003    Johansen
6,785,354 B1   8/2004    Dietrich
6,822,483 B1 * 11/2004   Fu et al. ............................ 327/2
7,099,400 B2   8/2006    Yang
7,221,723 B2   5/2007    Walker
7,321,248 B2   1/2008    Zhang (Continued)

FOREIGN PATENT DOCUMENTS

EP    0836282 A1    4/1998

OTHER PUBLICATIONS

Sonntag et al, A Digital and Data Recovery Architecture for Multi-Gigabit/s Binary Links, Aug. 2006, IEEE Journal of Solid-State Circuits, vol. 41, No. 8, Aug. 2006, pp. 1867-1875.*

(Continued)

*Primary Examiner* — Leon Flores
(74) *Attorney, Agent, or Firm* — Sam Talpalatsky; Nicholas J. Pauley; Joseph Agusta

(57) ABSTRACT

A bang-bang frequency detector with no data pattern dependency is provided. In examples, the detector recovers a clock from received data, such as data having a non-return to zero (NRZ) format. A first bang-bang phase detector (BBPD) provides first phase information about a phase difference between a sample clock and the clock embedded in the received data. A second BBPD provides second phase information about a second phase difference between the clock embedded in the received data and a delayed version of the sample clock. A frequency difference between the sample clock and the clock embedded in the received data is determined based on the first and second phase differences. The frequency difference can be used to adjust the frequency of the sample clock. A lock detector can be coupled to a BBPD output to determine if the sample clock is locked to the clock embedded in the received data.

48 Claims, 7 Drawing Sheets

(56) References Cited

U.S. PATENT DOCUMENTS

| | | | |
|---|---|---|---|
| 7,424,082 B2* | 9/2008 | Choi | 375/371 |
| 7,453,255 B2* | 11/2008 | Sunter et al. | 324/76.48 |
| 2002/0186087 A1 | 12/2002 | Kim et al. | |
| 2004/0042578 A1* | 3/2004 | Christensen et al. | 375/376 |
| 2004/0086069 A1 | 5/2004 | Engel et al. | |
| 2006/0083339 A1 | 4/2006 | Aziz et al. | |
| 2007/0009074 A1 | 1/2007 | Ma | |
| 2010/0302885 A1* | 12/2010 | Rhee et al. | 365/194 |
| 2011/0307722 A1* | 12/2011 | Flynn et al. | 713/322 |

OTHER PUBLICATIONS

Muller et al, CMOS Multichannel Single-Chip Receivers for Multi-Gigabit Optical Data Communications, May 2007, Springer, Analog Circuits and Signal Processing Series, ACSP.*

Chan et al, A Bang-Bang PLL Employing Dynamic Gain Control for Low Jitter and Fast Lock Times, 2006, Springer, Analog Integr Circ Sig Process (2006) 49:131-140.*

International Search Report and Written Opinion—PCT/US2012/020995—ISA/EPO—Jun. 26, 2012.

* cited by examiner

FULL DIGITAL BANG BANG FREQUENCY DETECTOR WITH NO DATA PATTERN DEPENDENCY

FIELD OF DISCLOSURE

The present disclosure relates generally to electronics, and more specifically, but not exclusively, to apparatus and methods for data clock recovery.

BACKGROUND

In receiver systems of communication networks, it is necessary to obtain accurate knowledge of phase and frequency of data received, in order to be able to sample and decode the data appropriately. The received data may be aligned to an unknown clock, and many times is subject to noise, jitter, and inter-symbol interference. Mining the data for frequency and phase information is challenging when the data is received at high frequencies and is in a non-return-to-zero (NRZ) format (NRZ data transitions between extreme high (+1) and extreme low (−1) without intermediate zero-level rest phases). Conventional approaches to obtain frequency and phase information of the data incur high power consumption, and are very prone to noise and jitter.

There are long-felt industry needs for techniques to mine data for frequency and phase information which have simple circuits and low power requirements, in order to improve performance of the receiver systems.

SUMMARY

Exemplary embodiments of the invention are directed to systems and methods for a fully digital bang-bang frequency detector with no data dependency.

In an example, a bang-bang frequency detector without data pattern dependency is provided. The frequency detector recovers a clock from received data, such as data having a non-return to zero (NRZ) format. A first bang-bang phase detector (BBPD) provides first phase information about a phase difference between a sample clock and the clock embedded in the received data. A second BBPD provides second phase information about a second phase difference between the clock embedded in the received data and a delayed version of the sample clock. Baud rate noise can be removed from the first and second phase information with decimators to smooth the first and second phase differences. A frequency difference between the sample clock and the clock embedded in the received data is determined based on the first and second phase differences. The frequency difference can be used to adjust the frequency of the sample clock to lock the sample clock to the clock embedded in the received data.

In a further example, a lock detector is coupled to the second BBPD's output to determine if the sample clock is locked to the clock embedded in the received data.

In another example, a phase error margin circuit is coupled to the second BBPD's output. The phase error margin circuit counts, after both a time delay and after the sample clock is locked to the clock embedded in the received data, a number of transitions having a phase error.

BRIEF DESCRIPTION OF THE DRAWINGS

The accompanying drawings are presented to aid in the description of embodiments of the invention and are provided solely for illustration of the embodiments and not limitation thereof.

Figure 1:
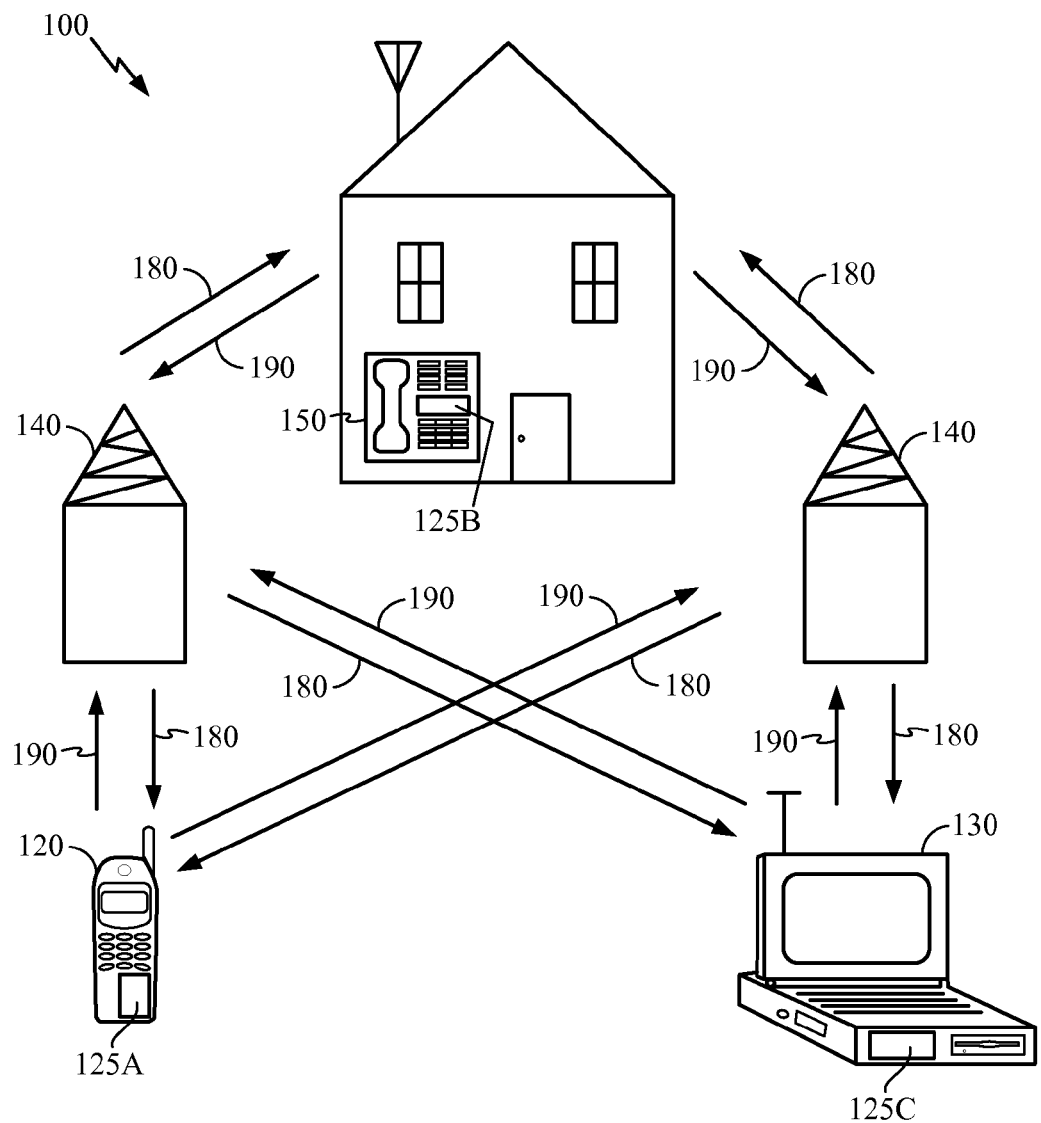
FIG. 1 depicts an exemplary communication system.

In accordance with common practice, some of the drawings may be simplified for clarity. Thus, the drawings may not depict all of the components of a given apparatus (e.g., device) or method. Finally, like reference numerals may be used to denote like features throughout the specification and figures.

DETAILED DESCRIPTION

Aspects of the invention are disclosed in the following description and related drawings directed to specific embodiments of the invention. Alternate embodiments can be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

It should be noted that the terms "connected," "coupled," or any variant thereof, mean any connection or coupling, either direct or indirect, between two or more elements, and can encompass the presence of one or more intermediate elements between two elements that are "connected" or "coupled" together. The coupling or connection between the elements can be physical, logical, or a combination thereof. As employed herein two elements can be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

It should be understood that the term "signal" can include any signal such as a data signal, audio signal, video signal, multimedia signal.

Information and signals can be represented using any of a variety of different technologies and techniques. For example, data, instructions, commands, information, signals, bits, symbols, and chips that can be referenced throughout this description can be represented by voltages, currents, electromagnetic waves, magnetic fields or particles, optical fields or particles, or any combination thereof.

It should be understood that any reference to an element herein using a designation such as "first," "second," and so forth does not generally limit the quantity or order of those elements. Rather, these designations can be used herein as a convenient method of distinguishing between two or more elements or instances of an element. Thus, a reference to first and second elements does not mean that only two elements can be employed there or that the first element must precede the second element in some manner. Also, unless stated otherwise a set of elements can comprise one or more elements. In addition, terminology of the form "at least one of: A, B, or C" used in the description or the claims means "A or B or C or any combination of these elements."

The terminology used herein is for the purpose of describing particular embodiments only and is not intended to be limiting of embodiments of the invention. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/ or groups thereof.

Further, embodiments are described in terms of actions to be performed by, for example, elements of a computing device. It will be recognized that various actions described herein can be performed by specific circuits (e.g., an application specific integrated circuit (ASIC), a physical layer device), by program instructions being executed by one or more processors, or by a combination of both. Additionally, the actions described herein can be considered to be embodied entirely within any form of computer readable storage medium having stored therein a corresponding set of computer instructions that upon execution would cause an associated processor to perform the functionality described herein. Thus, the various aspects of the invention can be embodied in a number of different forms, all of which have been contemplated to be within the scope of the claimed subject matter. In addition, for each of the embodiments described herein, the corresponding form of any such embodiments can be described herein as, for example, "logic configured to" perform the described action.

FIG. 1 depicts an exemplary communication system 100 in which an embodiment of the disclosure can be advantageously employed. For purposes of illustration, FIG. 1 shows three remote units 120, 130, and 150 and two base stations 140. It will be recognized that conventional wireless communication systems can have many more remote units and base stations. The remote units 120, 130, and 150 include at least a part of an embodiment 125A-C of the disclosure as discussed further herein. FIG. 1 shows forward link signals 180 from the base stations 140 and the remote units 120, 130, and 150, as well as reverse link signals 190 from the remote units 120, 130, and 150 to the base stations 140.

In FIG. 1, remote unit 120 is shown as a mobile telephone, remote unit 130 is shown as a portable computer, and remote unit 150 is shown as a fixed location remote unit in a wireless local loop system. For example, the remote units can be mobile phones, hand-held personal communication systems (PCS) units, portable data units such as personal data assistants, GPS enabled devices, navigation devices, settop boxes, music players, video players, entertainment units, fixed location data units such as meter reading equipment, receivers, or any other device that stores or retrieves data or computer instructions, or any combination thereof. Although FIG. 1 illustrates remote units according to the teachings of the disclosure, the disclosure is not limited to these exemplary illustrated units. Embodiments of the disclosure can be suitably employed in any device which includes active integrated circuitry including memory and on-chip circuitry for test and characterization.

Figure 2:
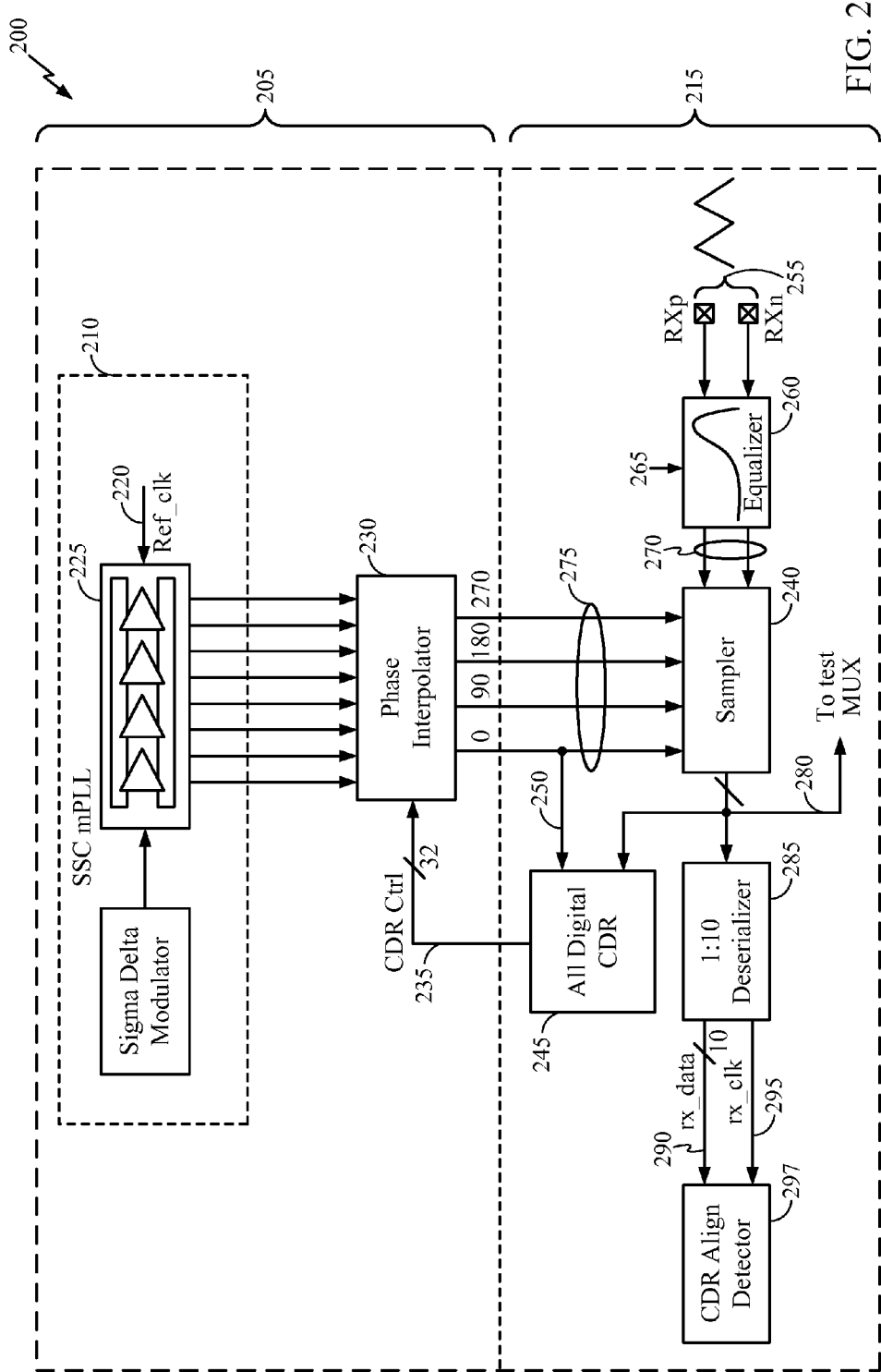
FIG. 2 depicts an exemplary digital receiver, which includes a clock section and a section for clock and data recovery (CDR).

FIG. 2 depicts an exemplary digital receiver 200, which includes a clock section 205 having a spread spectrum clock/ multiplexed phase locked loop (SSCmPLL) 210. The clock section 205 supplies a timing signal to a clock and data recovery (CDR) section 215.

The clock section 205 includes a reference clock 220. The reference clock 220 is input to a clock synthesis circuit (i.e., a phase-locked loop), such as delay line 225, the parallel output of which includes copies of the reference clock 220 that are delayed in phase, relative to each other. The clock synthesis circuit's parallel outputs are input to a phase interpolator 230. The phase interpolator 230 interpolates the delayed versions of the reference clock, based on a CDR control signal (CDRCtrl) 235. The phase interpolator's 230 parallel outputs are input to a sampler 240 in the CDR section 215. An output from the phase interpolator 230, having zero degrees of relative phase shift, is input to an all-digital CDR 245 as a sample clock 250.

The CDR section 215 receives clocked input data 255, having an input data clock, at a data input (RXp, RXn). In an example, the input data 255 is differential non-return to zero (NRZ) data. The input data 255 is equalized by an equalizer 260, which compensates for distortion in a transmission medium from which the CDR section 215 receives the input data 255. The equalizer 260 is controlled by an impulse control 265. The sampler 240 samples the equalized input data 270 with the phase interpolator's sampling signal 275 to form sampled data 280, which is a serial digital signal. The sampled data 280 is input to an all-digital CDR 245 and a deserializer 285. The deserializer 285 converts the serial sampled data 280 to parallel received data (rx_data) 290 and provides a received clock (rx_clk) 295, which form outputs of the CDR section 215. The received clock (rx_clk) 295 is phased so that it can be used to sample the received data (rx_data) 290 in a middle of an eye of the received data (rx_data) 290. The received data (rx_data) 290 and received clock (rx_clk) 295 are input to a CDR align detector 297, which detects proper alignment of the input data 255.

Figure 3:
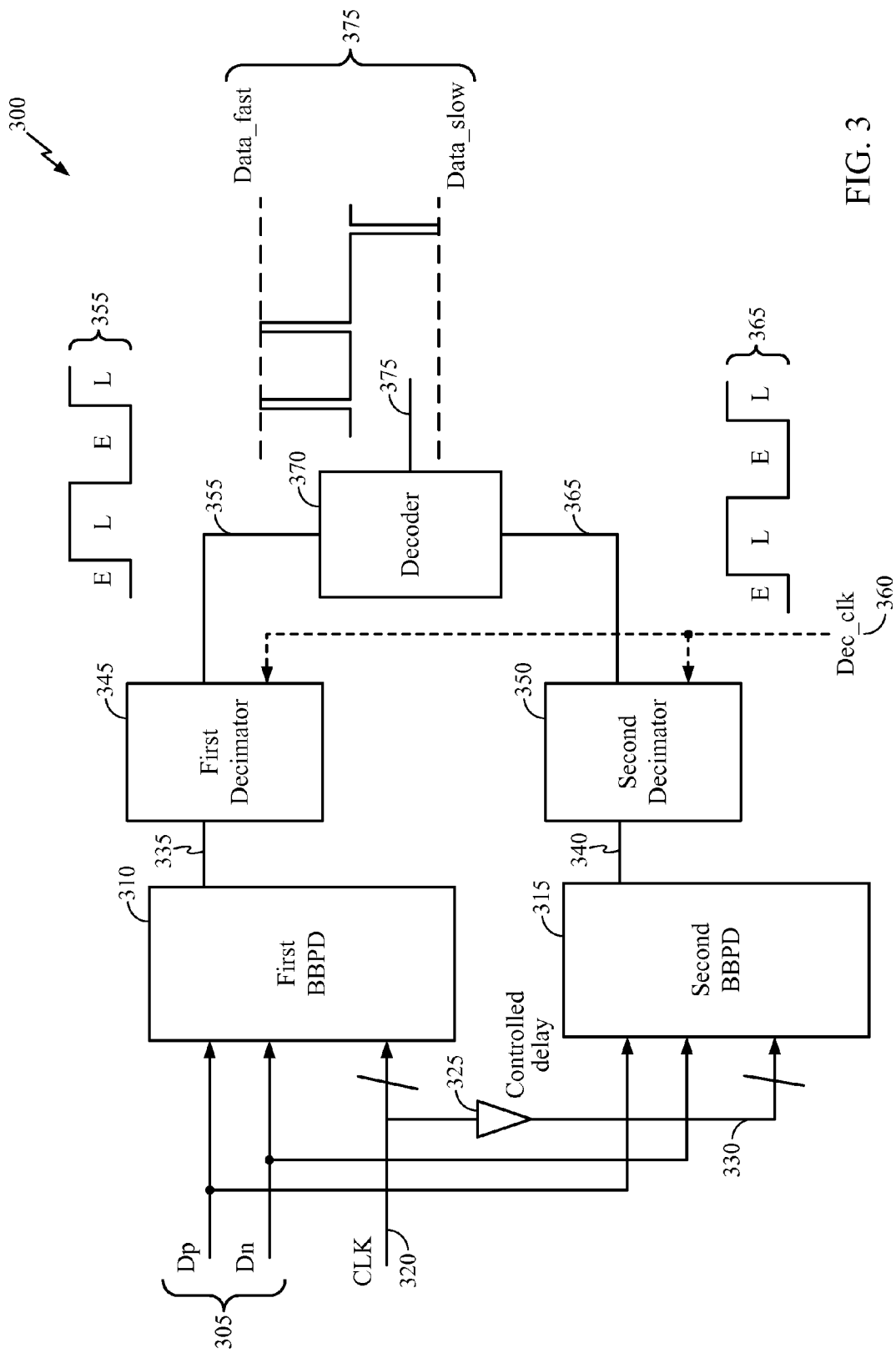
FIG. 3 is a block diagram of a frequency detector having multiple bang-bang phase detectors.

FIG. 3 is a block diagram of a frequency detector 300 having multiple bang-bang phase detectors. The frequency detector 300 can be a part of the all-digital CDR 245. Input data 305, such as the sampled data 280 is input to a first bang-bang phase detector (BBPD) 310 and a second bang-bang phase detector (BBPD) 315.

A BBPD provides information about a phase difference between a sample clock, and a clock associated with received data. However, a single BBPD operating alone as an open-loop frequency detector is not very accurate. For example, under one implementation, if the phase difference falls between 0 to $\pi$, then the BBPD determines that the received clock is "early," i.e., the sample clock is trailing behind. Similarly, if the phase difference falls between 0 to $-\pi$, the BBPD determines that the received clock is "late," i.e., the sample clock is ahead. Thus, in a $2\pi$ range, the single BBPD is able to provide information about whether the received clock is early or late in comparison with the sample clock. The single BBPD operating alone as an open-loop frequency detector does not provide enough information to determine frequency information, (i.e., whether the received clock is faster or slower), as the single BBPD only provides a pair of interleaving logic states having a zero-average output.

However, multiple BBPDs clocked at different times can indicate a derivative of a difference in phase between the sample clock and the clock embedded in the received data. The differential of the transition between states between the multiple BBPDs provides information about the frequency relation (slower or faster) between a sample clock 320 and the clock embedded in the received data. The sample clock 320, which in an example can be the sample clock 250, clocks the first BBPD 310.

The sample clock 320 is also delayed by a delay circuit 325 to form a delayed sample clock 330 that is input to the second BBPD 315. The delay circuit 325 can provide a time delay that is either fixed or adjustable. Any delay value can be used as long as the phase difference between the sample clock and the clock embedded in the received data is within $\pi$, and the delay is less than half of the unit interval of the input data 305.

The first BBPD 310 compares the phase of the sample clock 320 to the phase of the input data 305. If the phase of the input data 305 changes faster than the phase of the sample clock 320, then the first BBPD 310 outputs a first logic value, such as a logic one. If the phase of the input data 305 changes slower than the phase of the sample clock 320, then the first BBPD 310 outputs a second logic value, such as a logic zero. The first BBPD 310 does not provide a linear output, but instead provides a first BBPD output 335 indicating a first phase difference in a bi-stable digital form. The first BBPD output 335 indicates that the sample clock 320 is either early or late, relative to the clock embedded in the input data 305.

The second BBPD 315 operates in a manner similar to that of the first BBPD 310, but compares using the delayed sample clock 330 instead of the sample clock 320 to produce the second BBPD output 340, which indicates a second phase difference in a bi-stable digital form. The first BBPD output 335 can be input to a first decimator 345, such as a majority voter decimator.

Using the first decimator 345 and a second decimator 350 is optional, however, they remove baud rate noise and data dependency of the first and second phase differences. The first decimator 345 removes the baud rate noise from the first BBPD output 335 based on a decision clock (Dec_clk) 360 to produce a first decimator output 355. Similarly, the second BBPD output 340 is input to the second decimator 350, which removes the baud rate noise from the second BBPD output 340 based on the decision clock (Dec_clk) 360 to produce a second decimator output 365.

The first and second decimator outputs 355, 365 are input to a decoder 370. The decoder 370 determines which of the BBPD outputs 335, 340 are trailing and which are is leading, in order to determine whether the sample clock 320 is faster or slower than the input data clock, to produce a decoder output 375. The determining is based upon the first phase difference indicated by the first BBPD output 335 and the second phase difference indicated by the second BBPD output 340. Each BBPD output 335, 340 provides information regarding whether the input data clock is early or late with respect to its associated sample clock (with the second BBPD's sample clock being a delayed version of the first BBPD's sample clock). By comparing the waveforms of the two BBPD's outputs 335, 340, it can be determined that one of the waveforms is a time delayed version of the other.

If the second BBPD 315 (clocked with delayed sample clock 330) provides the leading waveform, i.e., enters new states ahead of the first BBPD 310, then the clock embedded in the received data is moving forward, or in other words, the input data's clock is faster than the sample clock 320. The sample clock's frequency is increased to synchronize and lock the sample clock 320 to the clock embedded in the received data. Thereafter, feedback circuits can be employed to iteratively decrease the speed of the sample clock 320 to catch up with the clock embedded in the received data, to close and lock the loop.

On the other hand, if it is determined that the second BBPD 315 is trailing, then the clock embedded in the received data is slower than the sample clock 320, and the sample clock's frequency is slowed to synchronize and lock the sample clock 320 to the clock embedded in the received data. Thereafter, feedback circuits can be employed to iteratively increase the speed of the sample clock 320 to catch up with the clock embedded in the received data, to close and lock the loop.

In this example, the sample clock 320 is delayed. In another example, the BBPDs are timed with a common clock, and the data input to one of the BBPDs is delayed in time. The arrangement also produces a pair of phase differences that can be processed in a manner similar to that described for the first and second phase differences.

Figure 4:
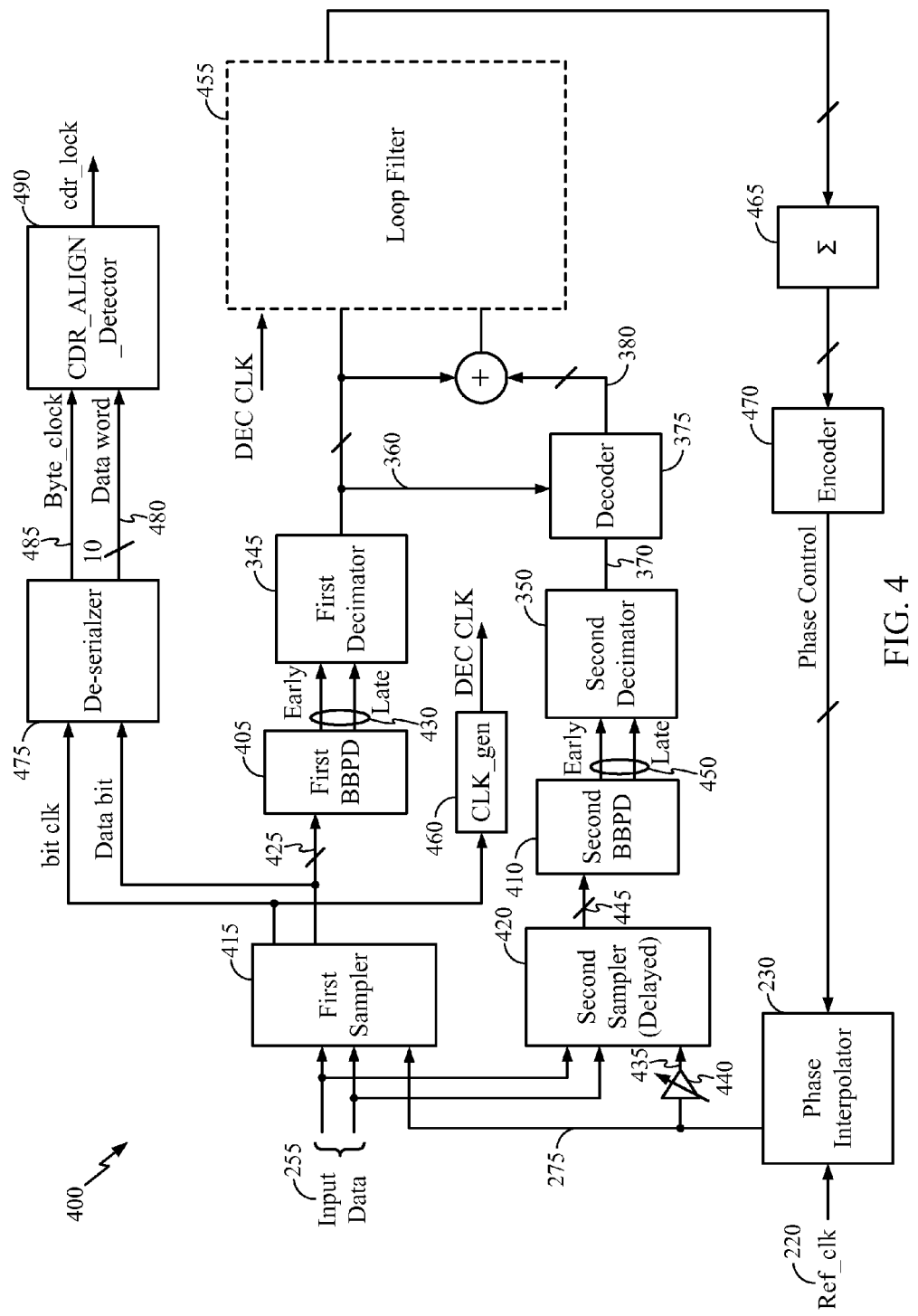
FIG. 4 depicts another exemplary CDR circuit having multiple bang-bang phase detectors for frequency detection.

FIG. 4 depicts an exemplary CDR circuit 400 having a first BBPD 405 and a second BBPD 410. The CDR circuit 400 is different from the frequency detector 300 in that the CDR circuit 400 includes a first sampler 415 and a second sampler 420.

In the CDR circuit 400, clocked input data 255 is input to the first sampler 415. The clocked input data 255 is received data with an embedded clock. In an example, the clocked input data 255 is differential non-return to zero (NRZ) data. Also input to the first sampler 415 is a sampling signal 275 from the phase interpolator 230. The first sampler 415 samples the input data 270 with the phase interpolator's 230 sampling signal 275 to form first sampled data (Data Bit) 425, which is a serial digital signal.

The first sampled data 425 is input to a first BBPD 405, which compares the phase of the sampling signal 275 to the phase of the clocked input data 255 to produce a first BBPD output 430 indicating a first phase difference. The first BBPD 405 does not provide a linear output, but instead provides the first BBPD output 430, which indicates a first phase difference in a bi-stable digital form. The first BBPD output 430 indicates than the clocked input data 255 is either faster or slower than the sampling signal 275. For example, if the phase of the clocked input data 255 changes faster than the phase of the sampling signal 275, then the first BBPD 405 outputs a first logic value, such as a logic one. If the phase of the clocked input data 255 changes slower that the phase of the sampling signal 275, then the first BBPD 405 outputs a second logic value, such as a logic zero. The first BBPD output 430 is input to a decoder 370 via an optional first decimator 345. The first decimator 345 removes baud rate noise from the first BBPD output 430.

In addition to being input to the first sampler 415, the equalized input data 270 is input to the second sampler 420. Also input to the second sampler 420 is a delayed sample clock 435 that is a delayed version of the sampling signal 275. The delayed sample clock 435 is formed by delaying the sampling signal 275 with a delay circuit 440. The delay circuit 440 can provide a time delay that is either fixed or adjustable. The second sampler 420 samples the clocked input data 255 with the delayed sample clock 435 to form second sampled data 445, which is a serial digital signal.

The second sampled data 445 is input to the second BBPD 410, which produces a second BBPD output 450 indicating a second phase difference. The second BBPD 410 operates in a manner similar to that of the first BBPD 405, but compares using the delayed sample clock 435. The second BBPD output 450 indicates a second phase difference in a bi-stable digital form. The second BBPD output 450 is input to the decoder 370, via the optional second decimator 350. The second decimator 350 operates in a manner similar to that of the first decimator 345.

The decoder 370 determines a frequency difference between the clock embedded in the received data and the sampling signal 275. The determination is based upon the first phase difference indicated by the first BBPD output 430 and the second phase difference indicated by the second BBPD output 450.

The decoder output 375 indicates the frequency difference with a tri-state output. For example, if the clock embedded in the clocked input data 255 is faster than the sampling signal 275, then the decoder output 375 is a first logic value, such as a positive one. In the opposite case, if the clock embedded in the clocked input data 255 is slower than the sampling signal 275, then the decoder output 375 is a second logic value, such as a negative one. When the clock embedded in the clocked input data 255 is substantially matched to the sampling signal 275, then the decoder output 375 is a third logic value, such as logic zero.

The tri-state output provides gain proportional to the frequency differential between the clock embedded in the received data and the sampling signal 275. During a tracking phase when the CDR circuit 400 is working to synchronize the sample and the clock embedded in the received data, tri-stating logic can provide a high gain (i.e., increase gain) to the loop in order to speed up the synchronization process. Once the sampling signal 275 have been locked, and the clocks synchronized in a stable phase, the tri-state output gain can be reduced, thus leading to power savings. Thus, after frequency acquisition, the gain is close to zero during the stable phase when the phase error is less than $\pi/2$, because there are few to no transitions of the second phase difference. The CDR circuit 400 can also employ a power control device to reduce power to the CDR circuit 400 during the stable phase. In an example, the power control circuit can reduce power to the CDR circuit 400 based on cessation of transitions of the second phase difference.

Once frequency and phase differences are ascertained, then a negative feedback loop, such as one using at least one of voltage controlled oscillator (VCO) or a phase locked loop (PLL), can be employed to iterate continuously over the frequency and phase differences until the sample clock is synchronized in frequency and phase with the clock embedded in the received data.

The decoder output 375 is filtered by a loop filter 455, such as a digital loop filter (DLF), which is a feedback loop filter clocked by a clock generator 460. The output of the loop filter 455 is summed in a summer 465, and encoded with an encoder 470 to adjust the phase interpolator 230. The phase interpolator 230 is adjusted to change the phase of the sampling signal 275 so that the sampling signal 275 substantially locks onto the clock embedded in the received data. As the frequency of the clock embedded in the received data varies, the CDR circuit 400 adjusts the sampling signal 275 to vary accordingly to regain and/or maintain a substantial lock with the clock embedded in the received data. When the CDR circuit 400 is locked, transitioning of the second phase difference ceases. Cessation of the second phase difference's transitions can be used as a trigger to reduce power to at least a part of the CDR circuit 400, to save power.

The CDR circuit 400 can also include a circuit to detect lock of the CDR circuit 400. Two types of CDR lock detectors are provided, the first of which is illustrated in FIG. 4. In the first type of CDR lock detector, the CDR circuit includes a deserializer 475. The deserializer 475 converts the first sampled data 425 from serial data to parallel data (Data word) 480, and provides a clock signal (byte clock) 485. The parallel data 480 and the clock signal 485 are input to a CDR align detector 490, which detects alignment of the input data 255 to indicate if the sampling signal 275 is substantially locked with the clock embedded in the received data.

Figure 5:
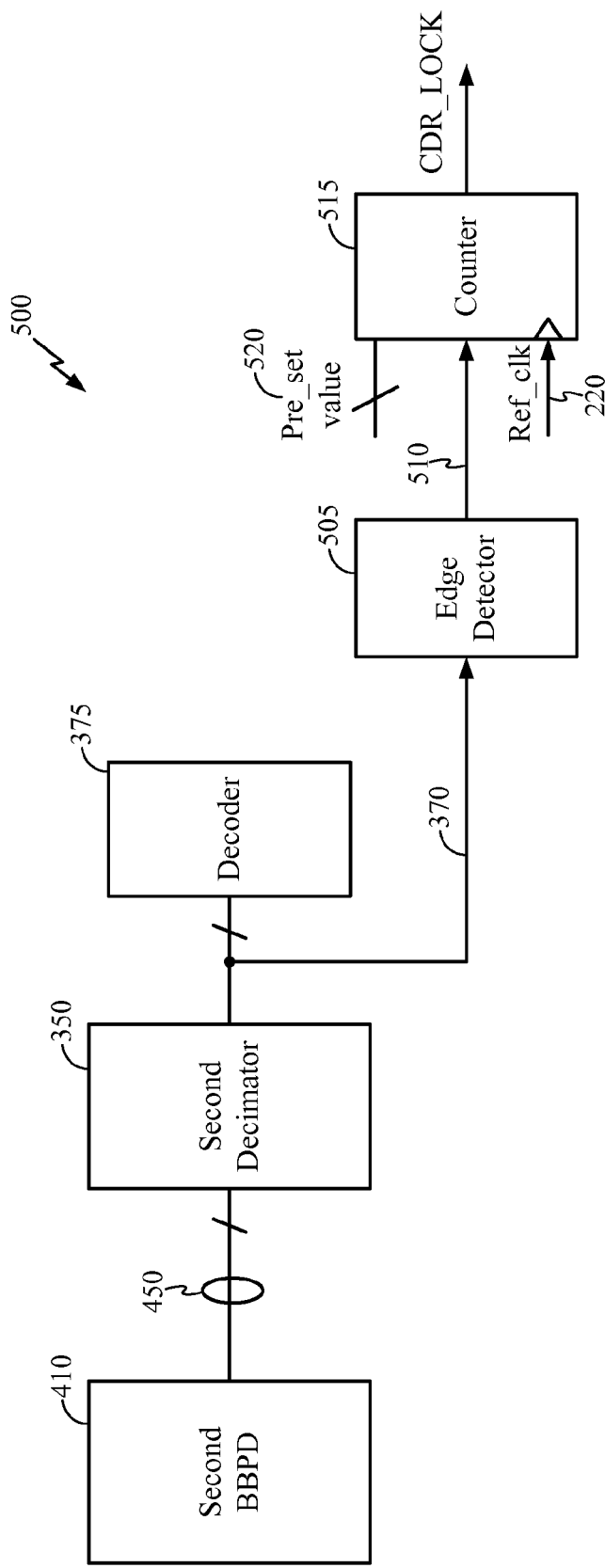
FIG. 5 depicts an exemplary CDR lock detector.

FIG. 5 depicts a second type of CDR lock detector 500 used with the CDR circuit 400. When the CDR circuit 400 is locked, the delayed sample clock 435 from the phase interpolator 230 transitions in the middle of the eye of the input data 255, and the decision clock (Dec_clk) aligns with the transitions of the input data 255. When the CDR circuit 400 is not locked, there are transitions at the second decimator output 365 (i.e., at the input to the decoder 370). To detect lock, an edge detector 505 detects edges of the second decimator output 365, and transitions an edge detector output 510 when an edge is detected. The edge detector output 510 resets a counter 515. The counter 515 counts down from a preset value. When the counter reaches zero, the counter 515 outputs an indication that the sampling signal 275 is substantially locked with the clock embedded in the received data. If the edge counter 505 is reset prior to reaching zero, then the CDR lock detector 500 does not indicate that the sampling signal 275 is substantially locked with the clock embedded in the received data. The margin of the edge detector 505 is set by adjusting the preset value 520 and the time delay of the delay circuit 440.

Figure 6:
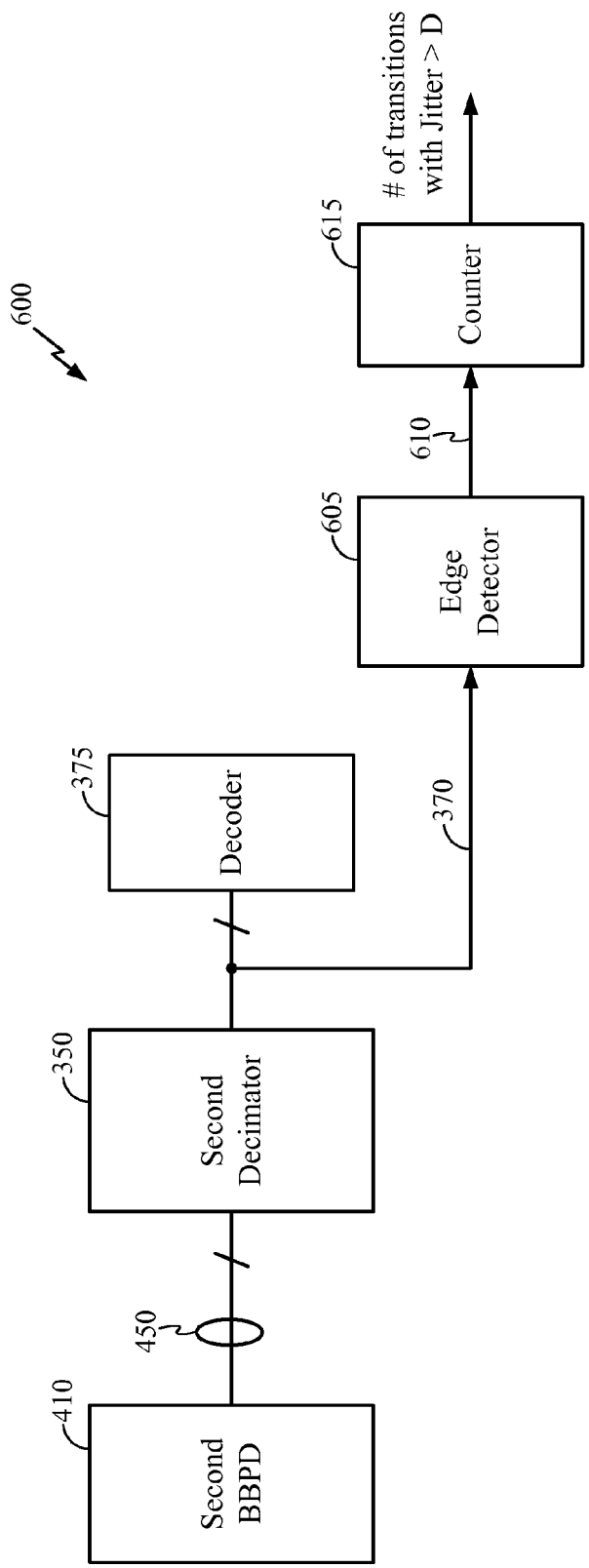
FIG. 6 depicts a jitter detector.

FIG. 6 depicts a jitter detector 600 (i.e., a phase error margin and built-in self-test circuit) coupled to the CDR circuit 400. Jitter can be detected after the CDR circuit 400 is locked. An edge detector 605 detects edges of the second decimator output 365 (i.e., at the input to the decoder 370), and transitions an edge detector output 610 when an edge is detected. A counter 615 counts the number of transitions of the second decimator output 365, after a delay period (D). Repeating the process with different delay periods can provide a distribution of phase errors.

Figure 7:
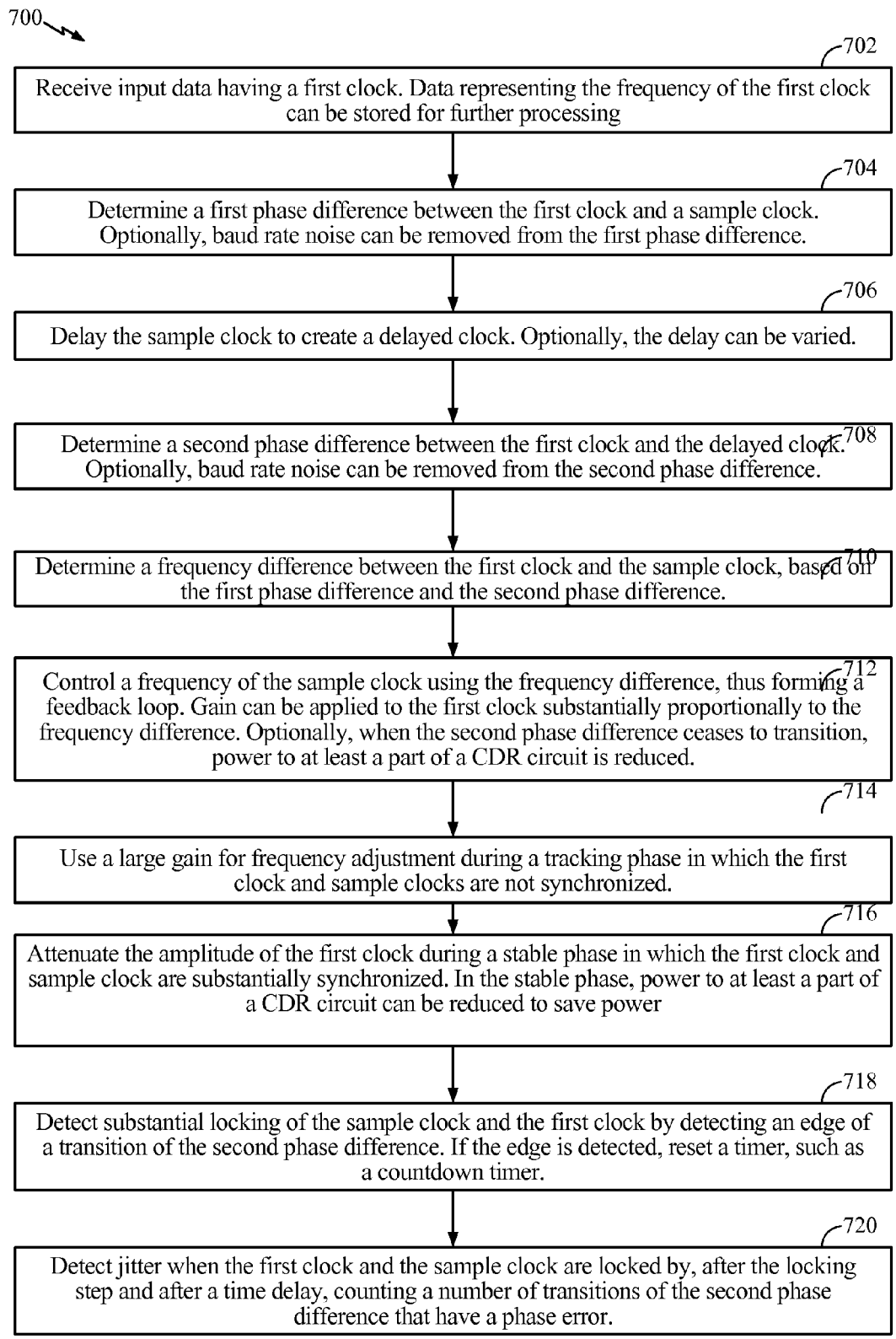
FIG. 7 is a flowchart of a method of recovering clock data.

FIG. 7 is a flowchart of a method of recovering clock data 700.

In step 702, input data having a first clock is received. Data representing the frequency of the first clock can be stored for further processing, such as recalling the frequency of the first clock to reduce time required to acquire the first clock.

In step 704, a first phase difference between the first clock and a sample clock is determined. Optionally, baud rate noise can be removed from the first phase difference.

In step 706, the sample clock is delayed to create a delayed sample clock. Optionally, the delay can be varied.

In step 708, a second phase difference between the first clock and the delayed clock is determined. Optionally, baud rate noise can be removed from the second phase difference.

In step 710, a frequency difference between the first clock and the sample clock is determined, based on the first phase difference and the second phase difference.

In step 712, a frequency of the sample clock is controlled using the frequency difference, thus forming a feedback loop. Gain can be applied to the first clock substantially proportionally to the frequency difference. Optionally, when the second phase difference ceases to transition, power to at least a part of a CDR circuit is reduced.

In step 714, a large gain is used for frequency adjustment during a tracking phase in which the first clock and sample clocks are not synchronized. Gain of the frequency adjustment is reduced during a stable phase.

In step 716, the amplitude of the first clock is attenuated during a stable phase in which the first clock and sample clock are substantially synchronized. In the stable phase, power to at least a part of a CDR circuit can be reduced to save power.

In step 718, substantial locking of the sample clock and the first clock can be detected. For example, the second phase difference is monitored for an edge of a transition and, if the edge is detected, a timer, such as a countdown timer, is reset.

In step 720, the second phase difference can be used as a basis for detecting jitter when the first clock and the sample clock are locked. To detect jitter, after the locking step and after a time delay, a number of transitions of the second phase difference that have a phase error are counted.

Those of skill in the art will appreciate that information and signals can be represented using any of a variety of different technologies and techniques. For example, data, instructions, commands, information, signals, bits, symbols, and chips that can be referenced throughout this description can be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein can be implemented as electronic hardware, computer software, or combinations of both. To clearly illustrate this interchangeability of hardware and software, various illustrative components, blocks, modules, circuits, and steps have been described herein generally in terms of their functionality. Whether such functionality is implemented as hardware or software depends upon the particular application and design constraints imposed on the overall system. Skilled artisans can implement the described functionality in varying ways for each particular application, but such implementation decisions should not be interpreted as causing a departure from the scope of the present invention.

The methods, sequences and/or algorithms described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium can be integral to the processor.

The teachings herein can be incorporated into various types of electrical devices, such as a serial advanced technology attachment (SATA) physical layer device (PHY), as well as other types of PHYs. The teachings herein can be also incorporated into various types of communication systems and/or system components. In some aspects, the teachings herein can be employed in a multiple-access system capable of supporting communication with multiple users by sharing the available system resources (e.g., by specifying one or more of bandwidth, transmit power, coding, interleaving, and so on). For example, the teachings herein can be applied to any one or combinations of the following technologies: Code Division Multiple Access (CDMA) systems, Multiple-Carrier CDMA (MCCDMA), Wideband CDMA (W-CDMA), High-Speed Packet Access (HSPA, HSPA+) systems, Time Division Multiple Access (TDMA) systems, Frequency Division Multiple Access (FDMA) systems, Single-Carrier FDMA (SC-FDMA) systems, Orthogonal Frequency Division Multiple Access (OFDMA) systems, or other multiple access techniques. A wireless communication system employing the teachings herein can be designed to implement one or more standards, such as IS-95, cdma2000, IS-856, W-CDMA, TDSCDMA, and other standards. A CDMA network can implement a radio technology such as Universal Terrestrial Radio Access (UTRA), cdma2000, or some other technology. UTRA includes W-CDMA and Low Chip Rate (LCR). The cdma2000 technology covers IS-2000, IS-95 and IS-856 standards. A TDMA network can implement a radio technology such as Global System for Mobile Communications (GSM). An OFDMA network can implement a radio technology such as Evolved UTRA (E-UTRA), IEEE 802.11, IEEE 802.16, IEEE 802.20, Flash-OFDM®, etc. UTRA, E-UTRA, and GSM are part of Universal Mobile Telecommunication System (UMTS). The teachings herein can be implemented in a 3GPP Long Term Evolution (LTE) system, an Ultra-Mobile Broadband (UMB) system, and other types of systems. LTE is a release of UMTS that uses E-UTRA. UTRA, E-UTRA, GSM, UMTS and LTE are described in documents from an organization named "3rd Generation Partnership Project" (3GPP), while cdma2000 is described in documents from an organization named "3rd Generation Partnership Project 2" (3GPP2). Although certain aspects of the disclosure can be described using 3GPP terminology, it is to be understood that the teachings herein can be applied to 3GPP (e.g., Rel99, Rel5, Rel6, Rel7) technology, as well as 3GPP2 (e.g., 1xRTT, 1xEV-DO RelO, RevA, RevB) technology and other technologies. The techniques can be used in emerging and future networks and interfaces, including Long Term Evolution (LTE).

The disclosed devices and methods can be designed and can be configured into GDSII and GERBER computer files, stored on a computer readable media. These files are in turn provided to fabrication handlers who fabricate devices, based on these files, with a lithographic device. The resulting products are semiconductor wafers that are then cut into semiconductor die and packaged into a semiconductor chip. The chips are then employed in devices described herein.

The methods disclosed herein comprise one or more steps or actions for achieving the described method. The method steps and/or actions can be interchanged with one another without departing from the scope of the claims. In other words, unless a specific order of steps or actions is specified, the order and/or use of specific steps and/or actions can be modified without departing from the scope of the claims.

Nothing that has been stated or illustrated is intended to cause a dedication of any component, step, feature, object, benefit, advantage, or equivalent to the public, regardless of whether it is recited in the claims.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention can be described or claimed in the singular, the plural is contemplated unless limitation to the singular is explicitly stated.

What is claimed is:

1. A clock data recovery (CDR) circuit, comprising:
a first clock associated with a data input;
a sample clock;
a first bang-bang phase detector (BBPD) configured to output a first phase difference, wherein the first phase difference is a phase difference between the first clock and the sample clock;
a delay circuit configured to provide a delayed sample clock, wherein the delayed sample clock is a delayed version of the sample clock;
a second BBPD configured to output a second phase difference, wherein the second phase difference is a phase difference between the first clock and the delayed sample clock; and a decoder configured to compare the first phase difference with the second phase difference to determine, based on relative timing between the first phase difference and the second phase difference, whether to increase or decrease the sample clock's frequency.

2. The CDR circuit of claim 1, further comprising:
a first decimator coupled between the output of the first BBPD and the decoder; and
a second decimator coupled between the output of the second BBPD and the decoder, wherein the first and second decimators are configured to remove baud rate noise from the first phase difference and the second phase difference.

3. The CDR circuit of claim 1, further comprising tri-state logic configured to increase a gain of the CDR circuit during a tracking phase in which the first clock and sample clocks are not synchronized.

4. The CDR circuit of claim 1, further comprising tri-state logic configured to decrease a gain value of the CDR circuit during a stable phase in which the first clock and sample clock are substantially synchronized.

5. The CDR circuit of claim 1, further comprising tri-state logic configured to vary a gain value of the CDR circuit substantially proportionally to the frequency difference.

6. The CDR circuit of claim 1, further comprising a clock data recovery loop into which the CDR circuit is integrated.

7. The CDR circuit of claim 1, wherein the delay circuit has a variable delay.

8. The CDR circuit of claim 1, further comprising a memory configured to store data representing the frequency of the first clock.

9. The CDR circuit of claim 1, further comprising a physical layer device into which the CDR circuit is integrated.

10. The CDR circuit of claim 1, further comprising a receiver into which the CDR circuit is integrated.

11. The CDR circuit of claim 1, further comprising a semiconductor die onto which the CDR circuit is disposed.

12. The CDR circuit of claim 1, further comprising a device, selected from the group consisting of a set top box, music player, video player, entertainment unit, navigation device, communications device, personal digital assistant (PDA), fixed location data unit, and a computer, into which the CDR circuit is integrated.

13. The CDR circuit of claim 1, further comprising a power control device configured to reduce power to the CDR circuit during a stable phase in which the first clock and sample clock are substantially synchronized.

14. The CDR circuit of claim 1, further comprising a power control device configured to reduce power to the CDR circuit after the second phase difference ceases to transition.

15. The CDR circuit of claim 1, further comprising a CDR lock detector coupled to the output of the second BBPD.

16. The CDR circuit of claim 15, wherein the CDR lock detector comprises:
an edge detector coupled to the output of the second BBPD; and
a counter having a reset input coupled to the output of the edge detector.

17. The CDR circuit of claim 1, further comprising a phase error margin circuit coupled to the output of the second BBPD.

18. The CDR circuit of claim 17, wherein the phase error margin circuit comprises:
an edge detector coupled to the output of the second BBPD; and
a counter coupled to the edge detector, and configured to count, after a time delay, a number of transitions of the second phase difference.

19. The CDR circuit of claim 1, wherein the decoder is configured to provide a tri-state output identifying whether to increase or decrease the sample clock's frequency.

20. The CDR circuit of claim 1, wherein an amplitude of the first phase difference and an amplitude of the second phase difference are equal.

21. The CDR circuit of claim 1, wherein the decoder is configured to compare the first phase difference with the second phase difference without comparing amplitude of the first phase difference and an amplitude of the second phase difference.

22. A method of recovering clock data, comprising:
receiving input data having a first clock;
determining a first phase difference between the first clock and a sample clock;
delaying the sample clock to create a delayed sample clock;
determining a second phase difference between the first clock and the delayed sample clock; and
comparing the first phase difference with the second phase difference to determine, based on relative timing between the first phase difference and the second phase difference, whether to increase or decrease the sample clock's frequency.

23. The method of claim 22, further comprising removing baud rate noise from at least one of the first or second phase difference.

24. The method of claim 22, further comprising amplifying the first clock during a tracking phase in which the first clock and sample clocks are not synchronized.

25. The method of claim 22, further comprising attenuating the first clock during a stable phase in which the first clock and sample clock are substantially synchronized.

26. The method of claim 22, further comprising varying gain applied to the first clock substantially proportionally to the frequency difference.

27. The method of claim 22, further comprising controlling a frequency of the sample clock with the frequency difference between the first clock and the sample clock.

28. The method of claim 22, further comprising varying the delay applied to the sample clock.

29. The method of claim 22, further comprising storing data representing the frequency of the first clock.

30. The method of claim 22, further comprising reducing power to at least a part of a CDR circuit during a stable phase in which the first clock and sample clock are substantially synchronized.

31. The method of claim 22, further comprising reducing power to at least a part of a CDR circuit after the second phase difference ceases to transition.

32. The method of claim 22, further comprising detecting lock of the sample clock and the first clock.

33. The method of claim 32, wherein the detecting step comprises:
detecting an edge of a transition of the second phase difference; and
resetting a timer if the edge is detected.

34. The method of claim 22, further comprising:
locking the first clock and the sample clock based on the frequency difference; and
counting, after the locking step and after a time delay, a number of transitions of the second phase difference having a phase error.

35. A clock data recovery (CDR) circuit, comprising:
means for receiving input data having a first clock;
means for determining a first phase difference between the first clock and a sample clock;
means for delaying the sample clock to create a delayed sample clock;
means for determining a second phase difference between the first clock and the delayed sample clock; and
means for comparing the first phase difference with the second phase difference to determine, based on relative timing between the first phase difference and the second phase difference, whether to increase or decrease the sample clock's frequency.

36. The CDR circuit of claim 35, further comprising means for removing baud rate noise from at least one of the first or second phase difference.

37. The CDR circuit of claim 35, further comprising means for amplifying the first clock during a tracking phase in which the first clock and sample clocks are not synchronized.

38. The CDR circuit of claim 35, further comprising means for attenuating the first clock during a stable phase in which the first clock and sample clock are substantially synchronized.

39. The CDR circuit of claim 35, further comprising means for controlling a frequency of the sample clock with the frequency difference between the first clock and the sample clock.

40. The CDR circuit of claim 35, further comprising means for varying the delay applied to the sample clock.

41. The CDR circuit of claim 35, further comprising means for storing data representing the frequency of the first clock.

42. The CDR circuit of claim 35, further comprising means for varying gain applied to the first clock substantially proportionally to the frequency difference.

43. The CDR circuit of claim 35, further comprising means for reducing power to at least a part of the CDR circuit during a stable phase in which the first clock and sample clock are substantially synchronized.

44. The CDR circuit of claim 35, further comprising means for reducing power to at least a part of the CDR circuit after the second phase difference ceases to transition.

45. The CDR circuit of claim 35, further comprising means for detecting CDR lock of the sample clock and the first clock.

46. The CDR circuit of claim 45, wherein the means for detecting CDR lock comprise:
means for detecting a transition of an edge of the second phase difference; and
means for restarting a timer if the edge is detected.

47. The CDR circuit of claim 35, further comprising:
means for locking the first clock and the sample clock based on the frequency difference; and
means for counting, after the locking step and after a time delay, a number of transitions having a phase error.

48. A non-transient computer-readable medium, comprising stored instructions that, if executed, cause a lithographic device to fabricate at least a part of a clock data recovery (CDR) circuit including:
a first clock associated with a data input;
a sample clock;
a first bang-bang phase detector (BBPD) configured to output a first phase difference, wherein the first phase difference is a phase difference between the first clock and the sample clock;
a delay circuit configured to provide a delayed sample clock, wherein the delayed sample clock is a delayed version of the sample clock;
a second BBPD configured to output a second phase difference, wherein the second phase difference is a phase difference between the first clock and the delayed sample clock; and
a decoder configured to compare the first phase difference with the second phase difference to determine, based on relative timing between the first phase difference and the second phase difference, whether to increase or decrease the sample clock's frequency.

* * * * *